United States Patent
Jevtic

(10) Patent No.: US 6,496,746 B2
(45) Date of Patent: Dec. 17, 2002

(54) METHOD AND APPARATUS FOR AUTOMATICALLY GENERATING SCHEDULES FOR WAFER PROCESSING WITHIN A MULTICHAMBER SEMICONDUCTOR WAFER PROCESSING TOOL

(75) Inventor: Dusan Jevtic, Santa Clara, CA (US)

(73) Assignee: Applied Materials, Inc., Santa Clara, CA (US)

( * ) Notice: Subject to any disclaimer, the term of this patent is extended or adjusted under 35 U.S.C. 154(b) by 65 days.

(21) Appl. No.: 09/804,808

(22) Filed: Mar. 13, 2001

(65) Prior Publication Data

US 2001/0011198 A1 Aug. 2, 2001

Related U.S. Application Data

(62) Division of application No. 08/871,746, filed on Jun. 9, 1997, now Pat. No. 6,201,999.

(51) Int. Cl.$^7$ .............................................. G06F 19/00
(52) U.S. Cl. .................... 700/100; 700/99; 700/101; 700/102; 700/121; 414/217; 414/222.01; 414/225.01; 118/719; 29/25.01; 438/907; 438/908
(58) Field of Search .................. 700/100, 101–103, 700/97, 99, 213–219, 121, 117; 414/217, 222.01, 225.01, 416, 331.01; 118/719; 29/25.01, 25.02, 25.03; 438/907, 908

(56) References Cited

U.S. PATENT DOCUMENTS

| | | | | |
|---|---|---|---|---|
| 5,105,362 A | * | 4/1992 | Kotani | 700/108 |
| 5,241,465 A | * | 8/1993 | Oba et al. | 705/8 |
| 5,354,413 A | * | 10/1994 | Smesny et al. | 156/345.47 |
| 5,580,419 A | * | 12/1996 | Berenz | 438/171 |
| 5,580,819 A | * | 12/1996 | Li et al. | 427/162 |
| 5,654,903 A | * | 8/1997 | Reitman et al. | 216/67 |
| 5,855,681 A | * | 1/1999 | Maydan et al. | 118/719 |
| 5,904,487 A | * | 5/1999 | Conboy et al. | 118/723 E |
| 5,909,994 A | * | 6/1999 | Blum et al. | 118/719 |
| 5,928,389 A | * | 7/1999 | Jevtic | 29/25.01 |
| 6,074,443 A | * | 6/2000 | Venkatesh et al. | 29/25.01 |
| 6,201,999 B1 | * | 3/2001 | Jevtic | 118/719 |
| 6,224,638 B1 | * | 5/2001 | Jevtic et al. | 29/25.01 |
| 6,336,204 B1 | * | 1/2002 | Jevtic | 414/936 |

* cited by examiner

*Primary Examiner*—Ramesh Patel
(74) *Attorney, Agent, or Firm*—Moser, Patterson and Sheridan, LLP

(57) ABSTRACT

A method and apparatus for producing schedules for a wafer in a multichamber semiconductor wafer processing tool comprising the steps of providing a trace defining a series of chambers that are visited by a wafer as the wafer is processed by the tool; initializing a sequence generator with a value of a variable defining initial wafer positioning within the tool; generating all successor variables for the initial variable value to produce a series of values of the variable that represent a partial schedule; backtracking through the series of variables to produce further partial schedules; and stopping the backtracking when all possible variable combinations are produced that represent all possible valid schedules for the trace. All the possible schedules are analyzed to determine a schedule that produces the highest throughput of all the schedules.

3 Claims, 8 Drawing Sheets

METHOD AND APPARATUS FOR AUTOMATICALLY GENERATING SCHEDULES FOR WAFER PROCESSING WITHIN A MULTICHAMBER SEMICONDUCTOR WAFER PROCESSING TOOL

This application is a divisional of U.S. Ser. No. 08/871,746, filed Jun. 9, 1997, now U.S. Pat. No. 6,201,999, entitled METHOD AND APPARATUS FOR AUTOMATICALLY GENERATING SCHEDULES FOR WAFER PROCESSING WITHIN A MULTICHAMBER SEMICONDUCTOR WAFER PROCESSING TOOL, which is hereby incorporated by reference in its entirety.

BACKGROUND OF THE INVENTION

1. Field of the Invention

The present invention relates to a multiple chamber wafer processing tool and, more particularly, to a method and apparatus for automatically generating a schedule(s) for a semiconductor wafer within a multiple chamber semiconductor wafer processing tool.

2. Description of the Background Art

Semiconductor wafers are processed to produce integrated circuits using a plurality of sequential process steps. These steps are performed using a plurality of process chambers. An assemblage of process chambers served by a wafer transport robot is known as a multiple chamber semiconductor wafer processing tool or cluster tool. FIG. 1 depicts, in part, a schematic diagram of an illustrative cluster tool known as the Endura® System manufactured by Applied Materials, Inc. of Santa Clara, Calif.

The cluster tool 100 contains, for example, four process chambers 104, 106, 108, 110, a transfer chamber 112, a preclean chamber 114, a buffer chamber 116, a wafer orienter/degas chamber 118, a cooldown chamber 102, and a pair of loadlock chambers 120 and 122. Each chamber represents a different stage or phase of semiconductor wafer processing. The buffer chamber 116 is centrally located with respect to the loadlock chambers 120 and 122, the wafer orienter/degas chamber 118, the preclean chamber 114 and the cooldown chamber 102. To effectuate wafer transfer amongst these chambers, the buffer chamber 116 contains a first robotic transfer mechanism 124. The wafers 128 are typically carried from storage to the system in a plastic transport cassette 126 that is placed within one of the loadlock chambers 120 or 122. The robotic transport mechanism 124 transports the wafers 128, one at a time, from the cassette 126 to any of the three chambers 118, 102, or 114. Typically, a given wafer is first placed in the wafer orienter/degas chamber 118, then moved to the preclean chamber 114. The cooldown chamber 102 is generally not used until after the wafer is processed within the process chambers 104, 106, 108, 110. Individual wafers are carried upon a wafer transport blade 130 that is located at the distal end of the first robotic mechanism 124. The transport operation is controlled by a sequencer 136.

The transfer chamber 112 is surrounded by and has access to the four process chambers 104, 106, 108 and 110 as well as the preclean chamber 114 and the cooldown chamber 102. To effectuate transport of a wafer amongst the chambers, the transfer chamber 112 contains a second robotic transport mechanism 132. The mechanism 132 has a wafer transport blade 134 attached to its distal end for carrying the individual wafers. In operation, the wafer transport blade 134 of the second transport mechanism 132 retrieves a wafer from the preclean chamber 114 and carries that wafer to the first stage of processing, for example, a physical vapor deposition (PVD) stage within chamber 104. Once the wafer is processed and the PVD stage deposits material upon the wafer, the wafer can then be moved to a second stage of processing and so on.

Once processing is complete within the process chambers, the transport mechanism 132 moves the wafer from the process chamber and transports the wafer to the cooldown chamber 102. The wafer is then removed from the cooldown chamber using the first transport mechanism 124 within the buffer chamber 116. Lastly, the wafer is placed in the transport cassette 126 within the loadlock chamber 122.

More generally, a cluster tool contains n chambers, denoted by $C_1, C_2, \ldots, C_n$, one or more transfer chambers (robots) 112 and 116, and one or more loadlocks 120 and 122. The exact arrangement of chambers, robots and loadlocks is referred to as the "configuration" of the tool. A wafer $W_a$ to be processed is taken from a loadlock, placed successively into various chambers as each chamber performs a particular process upon the wafer.

A wafer's trace is the trajectory of a particular wafer through the cluster tool; that is, a trace is the order in which chambers are visited by a wafer (not necessarily $C_{i+1}$ after $C_i$). This should be distinguished from the term "processing sequence" which is the order of applying processes (recipes) to a wafer. If more than one chamber performs the same process (parallel chambers), a given processing sequence may be satisfied by several different traces.

A wafer which completes its processing sequence and is returned to the loadlock is said to be processed by the tool. Roughly speaking, a tool's throughput is the number of wafers processed by the tool per unit of time. That is, if the tool needs t seconds to process $n_t$ wafers, then $$S_t := \frac{n_t}{t} \tag{3}$$

is the tool's throughput measured in the interval [0,t].

There are many ways to improve the tool's throughput for a given processing sequence. However, one important improvement is to use efficient scheduling routines for a given processing sequence.

The optimization of scheduling involves the choice of criteria used in deciding when to transfer a wafer from one chamber into the next (and which wafers should be moved, if any, prior to that move). A routine which schedules the movement of wafers through the cluster tool (based on a given processing sequence) is referred to as a "scheduling routine."

The steady-state throughput of a tool under scheduling routine A is denoted by S(A). If n>1 then, depending on a given processing sequence, one may consider a number of scheduling routines that fulfill the processing sequence. The routine which maximizes the value of throughput is deemed the "optimum" routine and the maximum attainable value of throughput is known as the tool's "capacity." That is, if A is the set of all possible scheduling routines for a given processing sequence, then A* is optimum if $$S(A^*) = \max\{S(A) | A \in A\} \tag{4}$$

Clearly, the tool's capacity S(A*) depends on a given processing sequence as well as on chamber and robot parameters within the processing sequence. The problem of finding efficient scheduling routines for a given processing sequence (especially, finding optimum routines, where possible) is of considerable practical importance.

Presently there is not an automatic method of determining the best schedule, given a particular trace, that provides the highest throughput for that trace. Typically, a trial and error method is used until a schedule is determined that provides a sufficient throughput. However, the sufficient throughput may not be the best throughput that is possible for a given trace.

Therefore, a need exists in the art for a method and apparatus that determines all possible schedules given a particular trace and, using a throughput modeling program determines the throughput for each of the possible schedules and selects a schedule for use within a cluster tool that provides the maximum throughput for the given trace.

SUMMARY OF THE INVENTION

The disadvantages heretofore associated with the prior art are overcome by an invention of a method and apparatus for determining all possible schedules that accomplish a given trace, applying a throughput model to each of the schedules, and determining the schedule or schedules that result in the highest throughput.

More specifically, the invention uses a set of deterministic rules to compute the various schedules. First, a schedule is defined as a series of "letters" that form a "word". Each letter in the word defines a possible positioning of wafers within a cluster tool. Of course, the positioning of the wafers within the tool must fulfill the trace, i.e., each letter must follow from a predecessor letter in accordance with a particular set of rules that define the trace.

Given a letter (input letter) representing present wafer positions, the invention computes all possible successor wafer positions, i.e., all possible valid successor letters, as well as the total number of successors for the input letter. The invention provides individual "modules" for successor computation for serial traces, parallel traces, and mixed traces. Using a backtracking technique to repeatedly compute, from any letter, all possible successor letters, and then compute all possible successor letters of the successor letters, a schedule tree is derived. The schedule tree contains all possible schedules that will fulfill a given trace. Each and every schedule can then be modeled to determine the expected throughput of each schedule. By comparing the throughput associated with each schedule, an optimal schedule or schedules is identified.

BRIEF DESCRIPTION OF THE DRAWINGS

The teachings of the present invention can be readily understood by considering the following detailed description in conjunction with the accompanying drawings, in which.

To facilitate understanding, identical reference numerals have been used, where possible, to designate identical elements that are common to the figures.

DETAILED DESCRIPTION

A. Overview of the Invention

As discussed above, FIG. 1 depicts, in part, a schematic diagram of a conventional multiple chamber semiconductor wafer processing tool. The depicted cluster tool 100 is controlled by a sequencer that executes the scheduling routines determined by the present invention. The present invention is embodied in a schedule generator 50 that produces scheduling routines which are executed by the sequencer 136.

Figure 1:
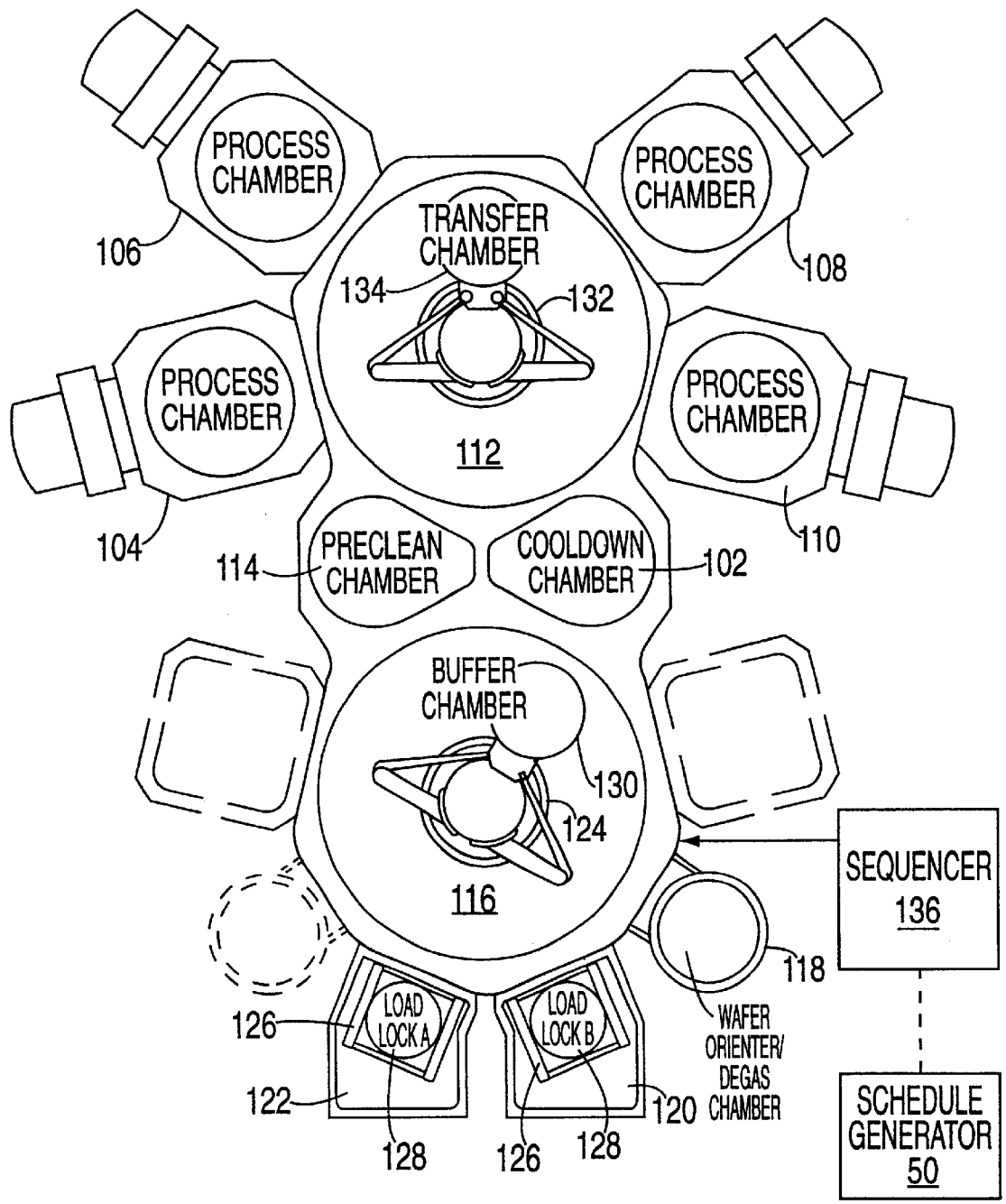
FIG. 1 depicts a schematic diagram of a multiple chamber semiconductor wafer processing tool being controlled by a sequencer that operates using scheduling routines generated by a schedule generator in accordance with the present invention.
Figure 2:
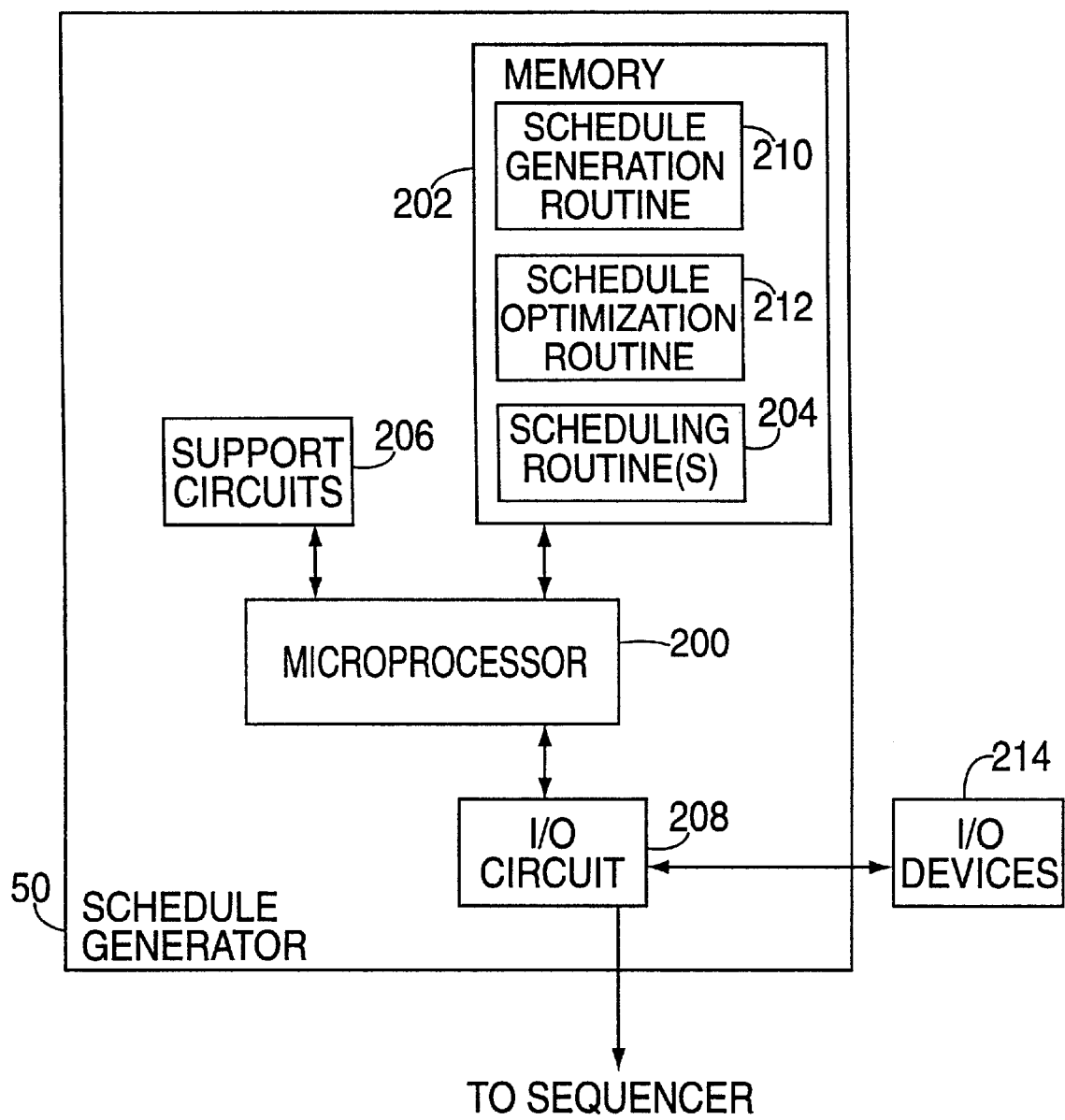
FIG. 2 depicts block diagram of schedule generator that performs operative steps in accordance with the present invention.

FIG. 2 depicts a block diagram of the scheduling generator 50 that produces the scheduling routines executed by the sequencer to control the cluster tool 100 of FIG. 1. Additionally, the schedule generator 50 operates to determine an optimal sequencing routine for a given processing sequence and tool configuration. Although, the schedule generator is shown to remotely produce schedules and download one or more schedules to the sequencer, those skilled in the art will understand that the invention could be practiced on a processor within the sequencer.

The schedule generator 50 contains a microprocessor 200 as well as memory 202 for storing a schedule generation routine 210, a schedule optimization routine 212 and the scheduling routine(s) generated by routines 210 and 212. The microprocessor 200 cooperates with conventional support circuitry 206 such as power supplies, clock circuits, cache, and the like as well as circuits that assist in executing the software routines. As such, it is contemplated that some of the process steps discussed herein as software processes may be implemented within hardware, e.g., as circuitry that cooperates with the microprocessor to perform various process steps. The schedule generator 50 also contains input/output circuitry 208 that forms an interface between conventional input/output (I/O) devices 214 such as a keyboard, mouse, and display as well as an interface to the sequencer. Although the schedule generator 50 is depicted as a general purpose computer that is programmed to determine scheduling routines in accordance with the present invention, the invention can be implemented in hardware as an application specific intergrated circuit (ASIC). As such, the process steps described herein are intended to be broadly interpreted as being equivalently performed by software, hardware, or a combination thereof.

The automatic schedule generator 50 of the present invention executes a schedule generation routine 210 that generates all possible schedules for a given trace. A schedule optimization routine 212 facilitates an automated process of producing an optimum schedule for a given cluster tool using an exhaustive search of all possible schedules.

The following definitions are used throughout this disclosure:

"Tool configuration" describes physical placement of chambers within a cluster tool. For example, the tool may have chambers $C_1$, $C_2$, $C_3$ and $C_4$, a LoadLock (LL) as well as one or more robots.

"Process sequence" is the order in which processes are applied to a given wafer. For example, $P_n$ is the name of the n-th process (e.g., etch) and, $P_1$, $P_2$, $P_3$, (which also may be written as $P_1 \rightarrow P_2 \rightarrow P_3$) is a process sequence.

"Processing capability" of a cluster tool is the result of mapping a required process sequence onto the set of chambers within the tool. The image of this mapping is called a "trace". For example, a process sequence $P_1 \rightarrow P_2 \rightarrow P_3$ may be mapped onto four chambers $C_1$, $C_2$, $C_3$ and $C_4$ to yield a trace $$LL \rightarrow C_1 \rightarrow (C_2 \vee C_3) \rightarrow C_4 \rightarrow LL.$$

Note that processes $P_1$ and $P_3$ are mapped into chambers $C_1$ and $C_4$, respectively, while process $P_2$ is mapped into $C_2 \vee C_3$ (the process $P_2$ is performed in both $C_2$ and $C_3$). Chambers $C_2$ and $C_3$ are said to be parallel because a wafer visits (is placed into) either $C_2$ or $C_3$ (but not both). In other words, the sign $\vee$ in $C_2 \vee C_3$ represents an exclusive OR function.

"Stage" is a set of one or more chambers which correspond to the same process. Wafers visit exactly one chamber from a given stage. The notation $(C_x \vee C_y \vee C_z)$ means that wafers can move to either chambers $C_x$ or $C_y$ or $C_z$, but only into one of the chambers. That is, $(C_x \vee C_y \vee C_z)$ is a stage comprised of three "parallel" chambers.

Generally speaking, the term "schedule" means a finite and repeatable sequence of wafer and robot movements through the cluster tool. More formally, let S be the set of all possible wafer and robot states. A string of symbols (letters) from a finite set of states S is referred to as a word. Symbols are represented as letters from the alphabet S. For example, if $S = \{0,1\}^2$, then $(0,0)$, $(0,1)$, $(1,0)$, and $(1,1)$ are all possible letters in alphabet S and $(0,1)(1,1)(0,1)$ is a word having a length of 3 letters over S. Each letter identifies the instantaneous state of the tool. For example, as is discussed in detail below, a letter may define the particular positioning of a wafer or wafers within a tool at a particular point in the trace.

Broadly speaking, whatever the specific alphabet, a schedule S is represented as a word, $$S = xyz \ldots uv \ldots rtx,$$

which starts and ends with the same letter (e.g., x), this is the only repeated letter, and a successor v of a given letter u must satisfy alphabet dependent rules, i.e., rules which define a valid trace.

Figure 3:
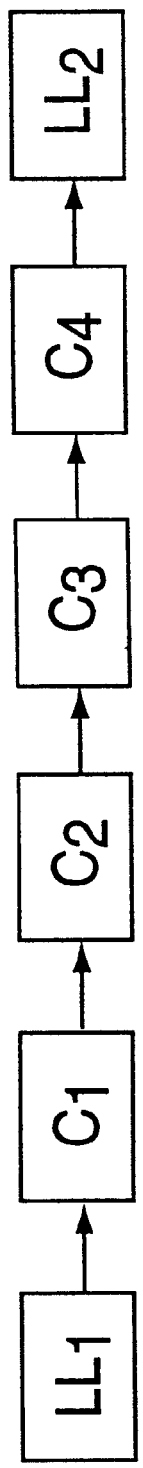
FIG. 3 depicts a flow diagram of a 4-chamber serial trace.
Figure 4:
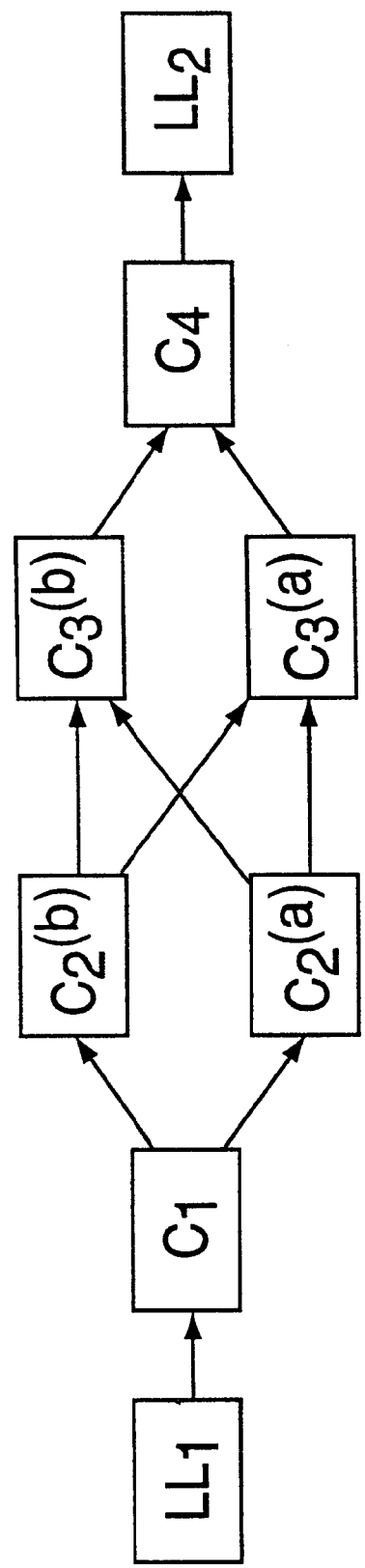
FIG. 4 depicts a flow diagram of a 4-chamber mixed trace.

Traces are available in three different configurations, A trace is a parallel trace if it is comprised of exactly one stage; a trace is a serial trace if each stage has exactly one chamber and a trace is a mixed trace if it is neither serial nor parallel. (Clearly, to have a mixed trace, the number of chambers in the trace is at least three.) A trace is said to be knotted if there is a chamber whose name appears more than once in the trace (that is, the corresponding process sequence contains a processing loop). To illustrate, FIGS. 3 and 4 schematically depict 4-stage serial and mixed traces, respectively.

Figure 5:
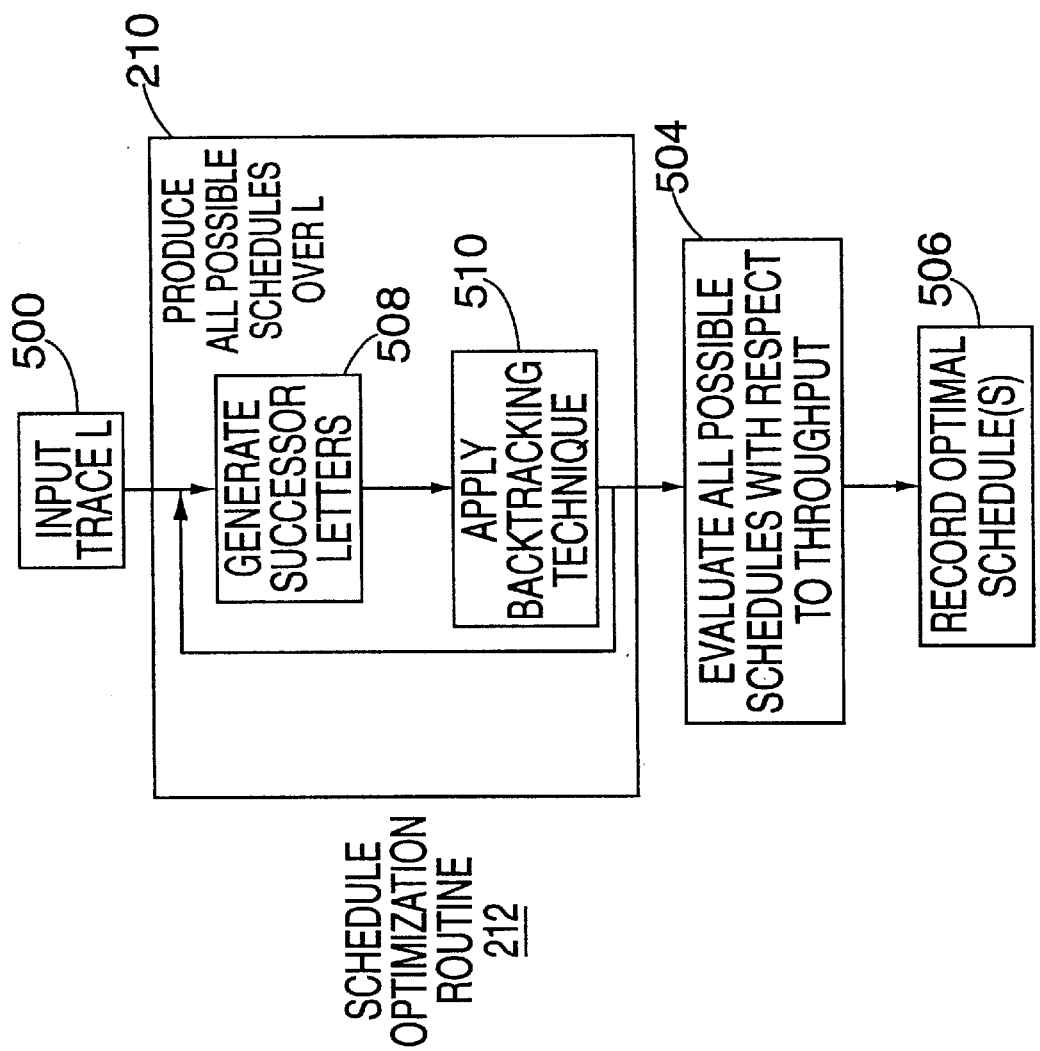
FIG. 5 depicts a flow diagram of a schedule optimization routine of the present invention.

FIG. 5 depicts a high level flow diagram of the schedule optimization routine 212. The optimization routine contains a schedule generation routine 210 that produces all possible schedules in an alphabet induced by a given trace. Routine 212 is an automated process that performs the following steps:

a) Input a trace L (step 500), b) Produce all possible schedules over L (routine 210) using a two step process, where the first step (step 508) generates all possible successor positions (letters) to which a wafer can be moved from a present position (letter) and the second step (step 510) uses a backtracking technique to change wafer positions such that other successor positions (letters) can be computed by step 508, c) Evaluate each of the schedules in (b) with respect to throughput (for a given set of robot and process parameters) (step 504), d) Record a schedule or a set of schedules which have the highest throughput for the given trace L (step 506).

Since step (c) requires a throughput simulation program, for computational efficiency, steps (a), (b) and (d) are generally incorporated into the simulation program.

A plurality of embodiments of the present invention are discussed below in Sections B, C, D and E of this disclosure. Specifically, the definitions of a schedule in a $\{0,1\}^n$ alphabet, rules for generating successors of a given letter, and modules needed for computation of successors are given in Section B for a serial trace and Section C for mixed and parallel traces. In Section D, these processes are extended to include robot utilization in the computations. Lastly, a generalized backtracking routine for generating all possible schedules from a given trace, applicable to any trace with or without a robot, is presented in Section E.

B. Schedule Generation for Serial Traces

An n-chamber serial trace (as illustratively depicted in FIG. 3), comprised of chambers $C_1, C_2, \ldots, C_n$, is associated with an n-tuple from the alphabet $\{0,1\}^n$. If $\bar{x}$ is such a tuple, then, for $i=1,2,\ldots,n$; $\bar{x}[i]=0$, if chamber $C_i$ is empty, and $\bar{x}[i]=1$, if $C_i$ contains a wafer. In accordance with this representation, a schedule S is a finite string of binary n-tuples, $$s = \bar{x} \ldots \overline{uv} \ldots \bar{x},$$

which starts and ends with the same binary n-tuple and this is the only repeated n-tuple in the string. In addition, any two consecutive n-tuples $\bar{u}$ and $\bar{v}$ in the string, $\bar{v}$ being a successor of $\bar{u}$, differ in at most two coordinates and are related in accordance with the following rules:

$s_1$) If $\bar{u}[1]=0$, then $\bar{v}[1]=1$. For all $k>1$, $\bar{v}[k]=\bar{u}[k]$. (This corresponds to a wafer being moved from the loadlock into $C_1$.)

$s_2$) If $\bar{u}[n]=1$, then $\bar{v}[n]=0$. For all $k<n$, $\bar{v}[k]=\bar{u}[k]$. (This corresponds to a wafer being moved from $C_n$ into the loadlock).

$s_3$) If, for some $k \notin \{0,n\}, \bar{u}[k]=1$ and $\bar{u}[k+1]=0$, then $\bar{v}[k]=0$ and $\bar{v}[k+1]=1$. For all $i \notin \{k, k+1\}, \bar{v}[i]=\bar{u}[i]$. (This corresponds to a wafer being moved from $C_k$ into $C_{k+1}$.)

Figure 6:
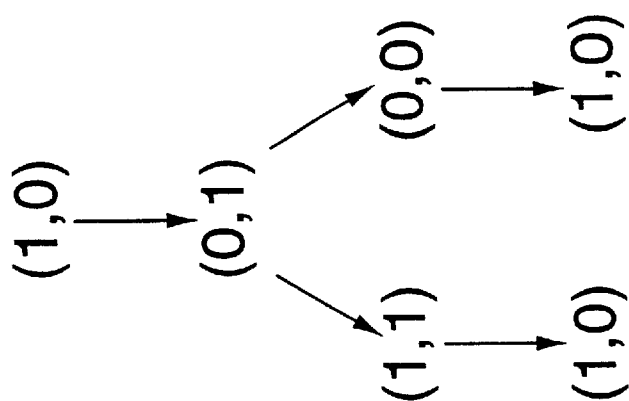
FIG. 6 depicts a tree diagram representing all possible schedules for a 2-chamber serial trace.
Figure 6A:
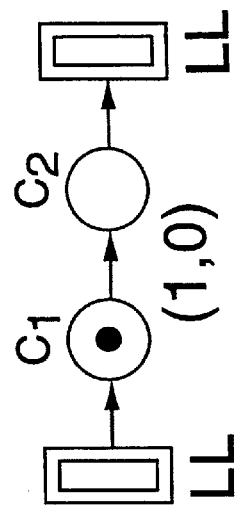
FIG. 6A depicts a schematic diagram of a 2-chamber serial trace of FIG. 6 showing a wafer in position (1,0)

FIG. 6 illustrates all possible schedules available (i.e., two schedules) in a 2-chamber serial trace. FIG. 6A depicts a schematic diagram of the 2-chamber serial trace of FIG. 6 having a wafer in position represented by the 2-tuple $(1,0)$. These n-tuples are referred to herein as the coordinates of wafer positioning. From position $(1,0)$, the schedule of FIG. 6 dictates that the wafer is next moved to a position represented by the 2-tuple $(0,1)$, i.e., a wafer is now in chamber $C_2$ and no wafer is in chamber $C_1$. Thereafter, the schedule may follow one of two paths, either the wafer in $C_2$ is moved to the loadlock (a wafer positioning that is represented by 2-tuple $(0,0)$) or another wafer is moved into chamber $C_1$ (a wafer positioning that is represented by 2-tuple (1,1)). As such, each 2-tuple represents a set of possible positions for a wafer or wafers that validly fulfill a step in the trace.

Figure 7:
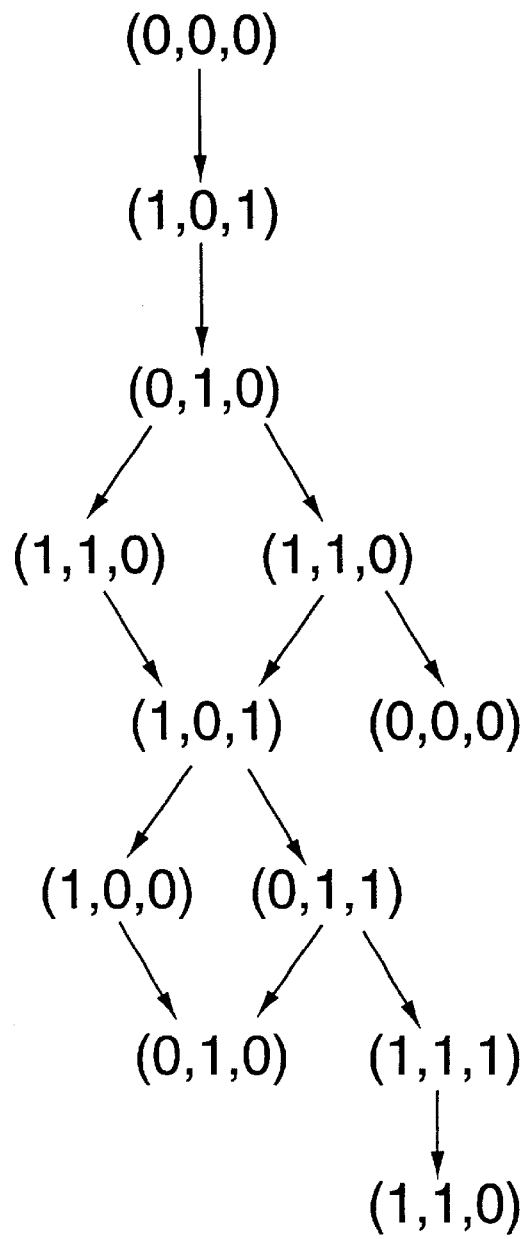
FIG. 7 depicts a tree diagram representing all possible schedules for a 3-chamber serial trace.
Figure 7A:
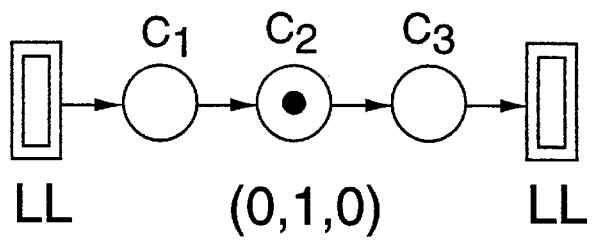
FIG. 7A depicts a schematic diagram of a 3-chamber serial trace of FIG. 7 showing a wafer in position (0,1,0)

Similarly, FIG. 7, illustrates the seven possible schedules available in a 3-chamber serial trace and FIG. 7A depicts a schematic diagram of the trace of FIG. 7 having a wafer positioning represented by the 3-tuple (0,1,0). From FIG. 7, the strings $S_p$=(1,1,1)(1,1,0)(1,0,1)(0,1,1,)(1,1,1)
$S_w$=(1,0,0)(0,1,0)(0,0,1)(0,0,0)(1,0,0)
$S_x$=(1,0,1)(0,1,1)(0,1,0)(1,1,0)(1,0,1).

represents particular scheduling routines that are generated by the schedule generator for a three chamber serial trace.

Such schedules may contain a set of robot and chamber parameters that yield higher or lower throughput than other schedules in the set of all schedules. As such, the only way to determine an optimum schedule is to examine the throughput under all possible schedules and, using the optimization routine, determine which of the schedules is optimal.

As mentioned above, the $2^n$ binary n-tuples (position coordinates) are regarded as letters from the alphabet $\{0,1\}^n$. A finite string of letters is referred to as a word. For example, strings $S_p$, $S_w$, and $S_x$ are all 5-letter words. In this terminology, a partial schedule S of length k is a k-letter word S(1)S(2) ... S(k) in which next letter S(i+1) depends only on the previous letter S(i), i=1,2, ... ,k−1, and is built according to rules $(s_1),(s_2)$, and $(s_3)$ stated above. In accordance with these rules, all letters in a partial schedule are different. A full schedule is a word W(1)W(2) ... W(n) such that W(1)W(2) ... W(n−1) is a partial schedule and W(n)=W(1). For example, the word W=(1,1,1)(1,1,0)(1,0,1)(0,1,1) is a partial schedule, where W(1)=(1,1,1) and W(4)=(0,1,1). (Generally, if W=$\bar{u}_1\bar{u}_2 \ldots \bar{u}_k$, then W(i)=$\bar{u}_i$).

From the definition of a schedule, if $\bar{u}_1\bar{u}_2 \ldots \bar{u}_k$ is a partial schedule, then $\bar{u}_1\bar{u}_2 \ldots \bar{u}_k\bar{u}_{k+1}$ is also a schedule (partial or full) provided $\bar{u}_{k+1}$ is obtained from $\bar{u}_k$ according to rules $(s_1),(s_2)$, and $(s_3)$. A given letter $\bar{u}_k$ may have anywhere from 1 to [n/2]+1 successors $\bar{u}_{k+1}$. The number of successors (variable nmb below) is easily determined by the following function:

```
function SerCount(ūₖ:letter): integer;
var
    i,nmb:integer;
begin
    nmb:=0
    for i:=1 to n−1
        if ūₖ[i]=1 and ūₖ[i + 1]=0
        then nmb:=nmb+1;
    nmb:=nmb+ūₖ[n] + ((1 + ūₖ[1]) (mod 2))
    return (nmb)
end;
``` where SerCount($\bar{u}_k$) represents the number of successors of $\bar{u}_k$ in a serial n-chamber trace. Since, in an exhaustive search, all the successors are examined, the foregoing pseudo-code determines the total number of successor letters that must be computed to complete an exhaustive search.

Generating all SerCount($\bar{u}$) successors of a given letter $\bar{u}$ is not particularly difficult. As each successor of $\bar{u}$ is generated, it is stored in a binary matrix Z that has SerCount($\bar{u}$) rows and (n+1) columns. The last column of Z is reserved for a Boolean variable that is set to true if the successor was used in a partial schedule and is set to false if the successor was not used. This entry is used later in the backtracking routine (discussed below with reference to FIG. 10) that generates all possible schedules for a given trace. The successors of a given letter are determined by the following function.

```
function SerGenerator(ū:letter): matrix;
var
    i:integer;
begin
    if ū[1] = 0 then begin
        copy (ū, v̄);
        v̄[1] = 1;
        store(v̄, Z);
    end;
    if ū[n] = 1 then begin
        copy (ū, v̄);
        v̄[n] = 0;
        store (v̄, Z);
    end;
    for i:=1 to n−1
    if ū[i]=1 and ū[i + 1]=0 then begin
        copy (ū, v̄);
        v̄[i]=0; v̄[i + 1]:=1;
        store (v̄, Z);
    end;
    return (Z);
end;
```

There are two functions which are used repeatedly in the above pseudo-code. Function copy ($\bar{u},\bar{v}$) returns letter $\bar{u}$ that is a replica of letter $\bar{v}$. This manner of implementing rules $(s_1)$, $(s_2)$, and $(s_3)$, in which the routine first copies $\bar{u}$ into $\bar{v}$ and then modifies $\bar{v}$, is not inefficient because $\bar{u}$ and $\bar{v}$ differ in at most two coordinates. Function store ($\bar{v},Z$) copies letter $\bar{v}$ into a proper row of matrix Z. Note that in the above module, the routine copies a binary n-tuple twice; clearly, in implementation, the routine copies the successor of $\bar{u}$ (slightly altered n-tuple $\bar{u}$) into the proper row of matrix Z directly.

Using the foregoing pseudo-code and given a letter $\bar{u}$ in a serial trace, the pseudo-code generates all possible successor letters of $\bar{u}$ and stores them in matrix Z. For example, in FIG. 7, given the letter (0,0,0), the pseudo-code produces a string of valid successor letters, e.g., letters (1,0,1), (0,1,0), (1,1,0), and (0,0,0). Given a different initial letter, a different valid set of successors is produced, e.g., letter (0,1,0) may produce letters (1,1,0), (1,0,1), (1,0,0) and (0,1,0).

C. Successor Generation for Mixed and Parallel Traces

The representation of an n-chamber mixed trace by a binary n-tuple is slightly more involved because exactly one chamber from a given stage is visited by a wafer and there are no wafer transfers within the stage. Thus, the schedule generation routine must recognize different stages as well as parallel chambers within a stage. FIG. 4 depicts an illustrative mixed trace containing four stages with six chambers, where chambers $C_1$ and $C_4$ are serial and chamber pairs $C_2(a)$, $C_2(b)$ and $C_3(a)$, $C_3(b)$ are parallel.

Without loss of generality, it is assumed that an n-chamber mixed trace is comprised of k successive stages, $F_1, F_2, \ldots ,F_k, k \leq n$. If 1,2, ... ,n are positions in a binary n-tuple $\bar{x}$ that corresponds to chambers $C_1, C_2, \ldots, C_n$, respectively, then positions 1,2, ..., $|F_1|$ corresponds to chambers in stage 1, positions $|F_1|+1, |F_1|+2, \ldots, |F_1|+|F_2|$ correspond to chambers in stage 2, and so on. If chamber $C_i$ belongs to stage $F_t$, then position i in the corresponding associated binary n-tuple $\bar{x}$ belongs to $F_t$ and i∈$F_t$ (while, in fact, i is one of the consecutive $|F_t|$ positions in $\bar{x}$).

In this representation, a schedule is a finite string of binary n-tuples which starts and ends with the same binary n-tuple. This is the only repeated letter in the word. In addition, if $\bar{v}$ is a successor of $\bar{u}$, then $\bar{u}$ and $\bar{v}$ differ in at most two coordinates and the following rules define the relationship of $\bar{u}$ and $\bar{v}$:

$m_1$) If for some $i \in F_1$, $\bar{u}[i]=0$, then $\bar{v}[i]=1$. For all $k \neq i$, $\bar{v}[k]=\bar{u}[k]$ (This corresponds to a wafer being moved from the loadlock into stage 1.)

$m_2$) If for some $i \in F_k$, $\bar{u}[i]=1$, then $\bar{v}[i]=0$. For all $j \neq i, \bar{v}[j] = \bar{u}[j]$. (This corresponds to a wafer being moved from the last stage $F_k$ into the loadlock).

$m_3$) If for some $i \in F_t$ and some $j \in F_{t+1}$, $\bar{u}[i]=1$ and $\bar{u}[j]=0$, then $\bar{v}[i]=0$ and $\bar{v}[j]=1$. For all $r \notin \{i,j\}$, $\bar{v}[r]=\bar{u}[r]$. (This corresponds to a wafer being moved from stage $F_t$ into the next stage $F_{t+1}$.)

In determining the number of successors of a given letter $\bar{u}$, it will be handy to define a sequence $M_O=0$ and $$M_t = |F_1| + |F_2| + \ldots + |F_t|,$$

where $|F_t|$ is the size (number of chambers) of stage $F_t$. The above sequence reflects the partition of the index set of $\bar{u}$ into stages. Clearly, $M_k=n$, where n is the number of chambers. The number of successors of $\bar{u}$ is determined by the following function:

```
function MixCount(ū:letter):integer;
var
    t, i, j, nmb:integer;
begin
    nmb:=0
    for i:=1 to M₁
        if ū[i] = 0
            then nmb:=nmb+1
    for j:=1+M_{k-1} to M_k
        if ū[i]=1
            then nmb:=nmb+1
    for t:=1 to k-1
        for i:=1+M_{t-1} to M_t
        for j:=1+M_t to M_{t+1}
            if ū[i]=1 and ū[j]=0
                then nmb:=nmb+1;
    return (nmb)
end;
```

Obviously, if $M_t=t$ and $k=n$ in the above pseudo-code, then MixCount($\bar{u}$) becomes SerCount($\bar{u}$). Also, for a pure parallel n-chamber trace, due to $k=1$, the 3-nested "for" statements in the above pseudo-code are null; by joining the first two loops (since there is just one stage), the pseudo-code reduces to:

```
function ParCount(ū:letter):integer;
var
    i,nmb:integer;
begin
    nmb:=0;
    for i:=1 to n
        if ū[i]=0 or ū[i]=1
            then nmb:=nmb+1;
    return (nmb)
end;
``` which always returns nmb=n. Thus, in a pure parallel n-chamber trace, any given letter has n successors.

A function that generates and stores all successors of a given letter in a mixed trace is:

```
function MixGenerator(ū:letter):matrix;
var
    t,i,j:integer;
begin
    for i:=1 to M₁
        if ū[i]=0 then begin
            copy (ū, v̄);
            v̄[i]:=1;
            store (v̄, Z)
        end;
    for j:=1+M_{k-1} to M_k
        if ū[j]=1 then begin
            copy (ū, v̄);
            v̄[j]:=0;
            store (v̄, Z)
        end;
    for t:=1 to k-1
        for i:=1+M_{t-1} to M_t
        for j:=1+M_t to M_{t+1}
            if ū[i]=1 and ū[j]=0 then begin
                copy (ū, v̄);
                v̄[i]:=0; v̄[j]:=1;
                store (v̄, Z)
            end;
    return (Z);
end;
```

Functions copy $(\bar{u},\bar{v})$ and store $(\bar{v},Z)$ are the same as in the corresponding routine for serial traces. (Note that this time matrix Z has MixCount$\bar{u}$ rows and (n+1) columns.) Again, if $M_t=t$ and $k=n$ in the above function, then MixGenerator($\bar{u}$) becomes SerGenerator($\bar{u}$). For pure parallel traces, due to $k=1$, a function that generates successors of a given letter $\bar{u}$ is:

```
function ParGenerator(ū:letter):matrix;
var
    i:integer;
begin
    for i:=1 to n
    begin
        copy (ū, v̄);
        if ū[i]=1
            then v̄[i]:=0
            else v̄[i]:=1
        store (v̄, Z)
    end;
    return (Z)
end;
```

Note the similarity between functions that count successors and functions that generate successors. In fact, conditions for identifying a successor are identical in both types of function; the difference is what is performed once the condition is detected.

Figure 8A:
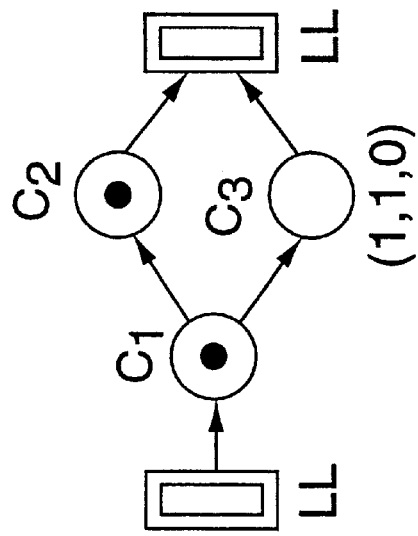
FIG. 8A depicts a schematic diagram of a 3-chamber mixed trace of FIG. 8 showing a wafer in position (1,1,0)
Figure 8:
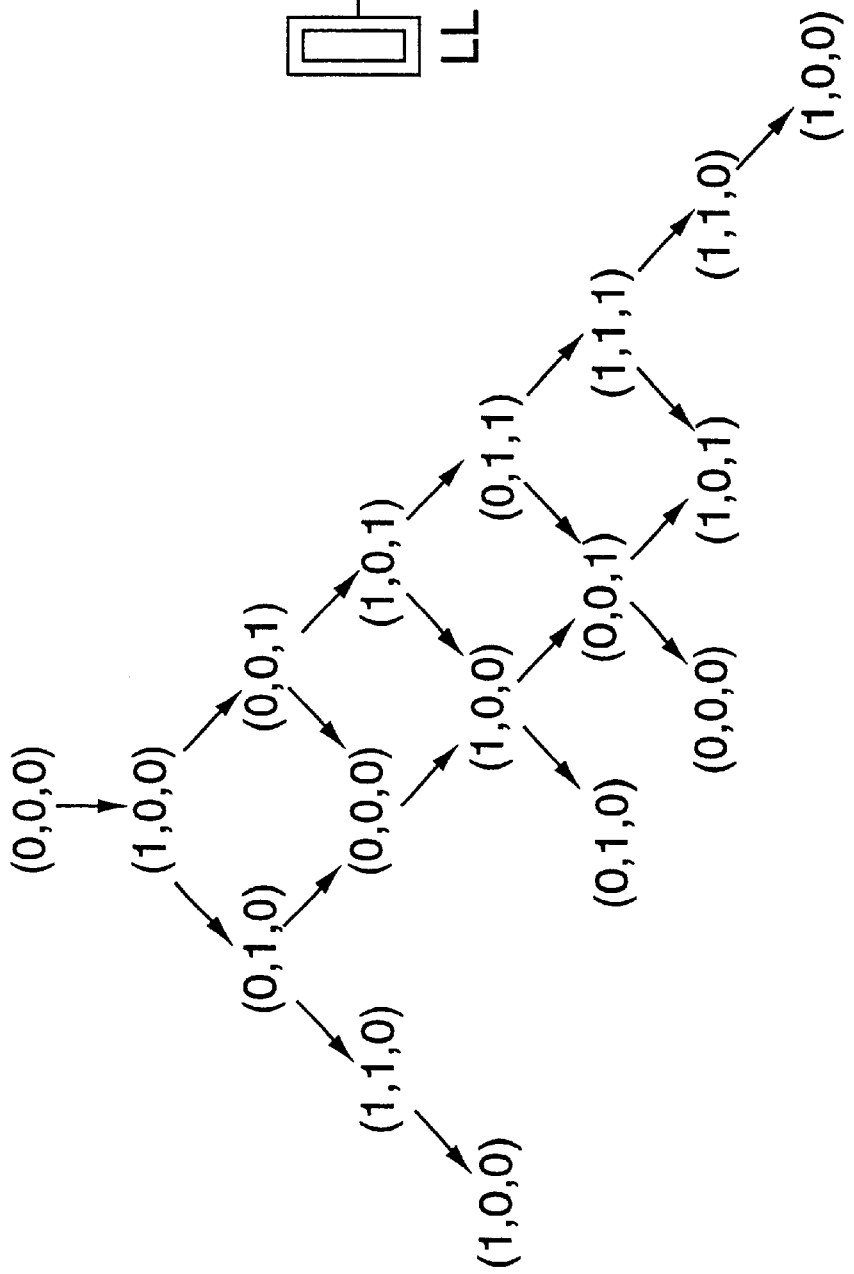
FIG. 8 depicts a tree diagram representing all possible schedules for a trace: LL-$C_1$-($C_2$,$C_3$)-LL.

FIG. 8 depicts an illustrative schedule tree for a 3-chamber mixed trace, (e.g., LL→$C_1$→($C_2 v C_3$)→LL), where the successors of a particular letter are determined using the MixGenerator($\bar{u}$) pseudo-code. FIG. 8A depicts a schematic diagram of the trace of FIG. 8 having wafers positioned in position (1,1,0).

D. Successor Generation tTat Includes Robot Position

When the schedule generation routine includes robot movements, than to an n-chamber serial trace, comprised of chambers $C_1, C_2, \ldots, C_n$, the routine must associate a (n+1)-tuple from $\{0,1\}^n \times \{0,1 \ldots, n\}$. If $\bar{x}$ is such a tuple, then, for $i=1,2,\ldots,n$, $\bar{x}[i]=0$, if chamber $C_i$ is empty; and $\bar{x}[i]=1$, if $C_i$ contains a wafer. Thus, as before, the first n coordinates of $\bar{x}$ are from $\{0,1\}$. The robot position is described by the last coordinate of $\bar{x}$, i.e., $x_3$ in the 3-tuple $(x_1, x_2; x_3)$, where $x_1$ and $x_2$ are wafer coordinates and $x_3$ is a robot coordinate. We set $\bar{x}[n+1]=k$ if (and only if) the robot is in a home position at chamber $C_k$. If $\bar{x}[n+1]=0$, the robot is positioned at the loadlock.

Let $S_n$ represent the alphabet of the above association. For example, if n=2, then $S_2$ is comprised of twelve 3-tuples, namely, $S_2 = \{(0,0;0),(0,0;1),(0,0;2);(0,1;0),(0,1;1),(0,1;2); (1,0;0), (1,0;1),(1,0;2);(1,1;0),(1,1;1),(1,1;2)\}$.

For an n-chamber serial trace, $|S_n|$ is the number of (n+1)-tuples from $\{0,1\}^n(\{0,1,\ldots,n\}$ and thus $|S_n|=(n+1)2^n$. These (n+1)-tuples are referred to as letters from the alphabet $S_n$. As before, a word is a finite string of letters from $S_n$. For example, (0,0;0)(1,0;1)(0,1;2)(0,1;0)(1,1;1)(1,1;2)(1,0;0)(1,0;1)

is an 8-letter word. Note that a word may contain repeated letters. For example, abcdaxy is a word, but not a schedule.

In this representation, a schedule S is a word (a string of the above described (n+1)-tuples), $S = \overline{xz} \ldots \overline{uv} \ldots \overline{yx}$, which starts and ends with the same letter and this is the only repeated letter. Furthermore, any two consecutive letters $\bar{u}$ and $\bar{v}$ (where $\bar{v}$ is a successor of $\bar{u}$) differ in at most three coordinates and are related in accordance with the following rules:

a) If $\bar{u}[1]=0$ and $\bar{u}[n+1]=0$, then $\bar{v}[1]=1$ and $\bar{v}[n+1]=1$. For all $i \notin \{1,n+1\}$, $\bar{v}[i]=\bar{u}[i]$. (This correspondence to a wafer being moved from the loadlock to $C_1$.)

b) If $\bar{u}[n]=1$ and $\bar{u}[n+1]=n$, then $\bar{v}[n]=0$ and $\bar{v}[n+1]=0$. For all $i \notin \{n,n+1\}$, $\bar{v}[i]=\bar{u}[i]$. (This corresponds to a wafer being moved from $C_n$ into the loadlock.)

c) If for some $r \in \{0,n\}$, $\bar{u}[r]=1$ and $\bar{u}[r+1]=0$ and $\bar{u}[n+1]=r$, then $\bar{v}[r]=0$ and $\bar{v}[r+1]=1$ and $\bar{v}[n+1]=r+1$. For all $i \notin \{r,r+1,n+1\}$, $\bar{v}[i]=\bar{u}[i]$. (This corresponds to a wafer being moved from $C_k$ into $C_{(k+1)}$, where neither $C_k$ nor $C_{(k+1)}$ is a loadlock.)

d) If $\bar{u}[1]=0$ and $\bar{u}[n+1]=j$ where $j \neq 0$, then $\bar{v}[n+1]=0$. For all $i \neq n+1$, $\bar{v}[i]=\bar{u}[i]$. (This corresponds to a robot moving from home position at $C_j$ to a home position at a loadlock in preparation for a wafer moving from the loadlock into $C_1$.)

e) If $\bar{u}[n]=1$ and $\bar{u}[n+1]=j$ where $j \neq n$, then $\bar{v}[n+1]=n$. For all $i \neq n+1$, $\bar{v}[i]=\bar{u}[i]$. (This corresponds to a robot moving from a home position at $C_j$ to a home position at $C_n$ in preparation for a wafer move from $C_n$ into loadlock.)

f) If for some $r \notin \{0,n\}$, $\bar{u}[r]=1$ and $\bar{u}[r+1]=0$ and $\bar{u}[n+1]=j$ where $j \neq r$, then $\bar{v}[n+1]=r$. For all $i \neq n+1$, $\bar{v}[i]=\bar{u}[i]$. (This corresponds to a robot moving from a home position at $C_j$ to a home position at $C_r$ in preparation for a wafer moving from $C_r$ into $C_{r+1}$; $C_o$ represents the loadlock.)

Note that rules (a), (b), and (c) above are, in fact rules $(s_1),(s_2)$, and $(s_3)$, respectively, when the robot is already prepositioned to move a wafer, while (d),(e), and (f) correspond to prepositioning the robot for moves defined by rules (a),(b), and (c), respectively.

A routine that calculates the number of successors of a given letter as well as finds and stores these successors is designed in a similar manner as in the previous cases for mixed and serial traces (this time by following the steps (a) through (f)). In such a routine, the number of successors is considerably large because, every time a wafer transfer is possible (e.g., $\bar{u}[i]=0$ or $\bar{u}[n]=1$ or $\bar{u}[i]=1$ and $\bar{u}[i+1]=0$, a robot may have to be prepositioned (e.g., from any of the n−1 positions $j \neq 0$ or $j \neq n$ or $j \neq i$). To achieve routines for determining the number of successors and the successors themselves that includes robot position, the new functions used are modifications of SerCount($\bar{u}$) and SerGenerator($\bar{u}$) (or MixCount($\bar{u}$) and MixGenerator($\bar{u}$)). Given the foregoing description of SerCount($\bar{u}$), SerGenerator($\bar{u}$), MixCount($\bar{u}$) and MixGenerator($\bar{u}$), a person skilled in the art could readily modify these functions to account for robot position using the aforementioned rules (a)–(f).

E. Generating Schedules from a Trace Using a Backtracking Technique

Backtracking algorithms use special problem-tailored techniques to systematically explore implicitly directed graphs (usually trees). Such algorithms are well known in the art. In the schedule generation routine, a backtracking algorithm is used in conjunction with one or more of the previously discussed successor generation routines (e.g., SerGenerator($\bar{u}$) or MixGenerator($\bar{u}$)) to produce every possible schedule given a particular trace.

Let $\bar{u}_1$ be the starting letter of a schedule. By using the rules for adding a successor letter as discussed in Sections B, C or D above, the foregoing routines build a partial schedule, say $S = \bar{u}_1 \bar{u}_2 \ldots \bar{u}_k$. There are two questions to answer every time a new letter $\bar{u}_{k+1}$ is added to partial trace S:

a) Is $\bar{u}_1 \bar{u}_2 \ldots \bar{u}_k \bar{u}_{k+1}$ a full schedule?
b) If $\bar{u}_1 \bar{u}_2 \ldots \bar{u}_k \bar{u}_{k+1}$ is a full schedule, are there other full schedules which have not been recorded?

A word $\bar{u}_1 \bar{u}_2 \ldots \bar{u}_{k+1}$ is recognized as a full schedule if it is built according to rules for successor letters and if there exists an index i<k+1 such that $\bar{u}_i = \bar{u}_{k+1}$ and all letters $\bar{u}_1, \bar{u}_2, \ldots, \bar{u}_k$ are different. Thus, to determine a full schedule a routine checks whether or not $\bar{u}_{k+1} \neq \bar{u}_i$, i=1,2,…,k, for every newly appended letter $\bar{u}_{k+1}$ which is a proper successor of $\bar{u}_k$.

Once it is found that $\bar{u}_i = \bar{u}_{k+1}$ for some i<k+1, the routine either prints or stores the full schedule $\bar{u}_i, \bar{u}_{i+1}, \ldots, \bar{u}_{k+1}$. To find other schedules, the routine removes $\bar{u}_{k+1}$ from the full schedule S and looks at some other unused successor of $\bar{u}_k$. If there is such a successor, say letter $\bar{z}$, the routine checks if $\bar{u}_1 \ldots \bar{u}_k \bar{z}$ is a full schedule. If $\bar{u}_1 \ldots \bar{u}_k \bar{z}$ is not a full schedule, the routine looks at unused successors of $\bar{z}$ and so on. If $\bar{u}_1 \ldots \bar{u}_k \bar{z}$ is a full schedule, the routine removes $\bar{z}$ and looks at another unused successor of $\bar{u}_k$. If there are no unused successors of $\bar{u}_k$, the routine goes back (backtrack) and looks at unused successors of $\bar{u}_{k-1}$ and so on, until the routine returns to the starting letter $\bar{u}_1$. Basically, the routine contains the following sequence of steps:

1. (Initialize.) Choose the letter $\bar{u}_1$ of a schedule and go to Step 2.
2. If schedule $\bar{u}_1 \bar{u}_2 \ldots \bar{u}_k$ is not complete, go to step 3. Else, go to Step 4.
3. Find a successor letter (of the last letter $\bar{u}_k$, in the schedule) which was not used, append it to the partial schedule and go to Step 2. If there are no unused successors, go to step 5.
4. Print or store the schedule and go to Step 5.
5. If there are no more schedules, then STOP. Else, go to Step 6.
6. (Backtrack.) Remove the last letter from the complete schedule and go to Step 3.

Clearly, the routine must ensure that it does not print (store) duplicate schedules in Step 4 as well as that the routine has printed (stored) all possible schedules. The former is accomplished in Step 3 where the routine appends only an unused successor of the last letter to the partial schedule. The latter is ensured by a proper termination condition (for example, the routine is at $\bar{u}_1$ (the initial letter) and there are no unused successors). It is convenient to choose the first letter $\bar{u}_1$ so that it has only one successor, e.g., $\overline{u}_1=\overline{0}$ or $\overline{u}_1=\overline{e}_1$, where $\overline{e}_k$ is the k-th column (row) of an n by n identity matrix.

Figure 9:
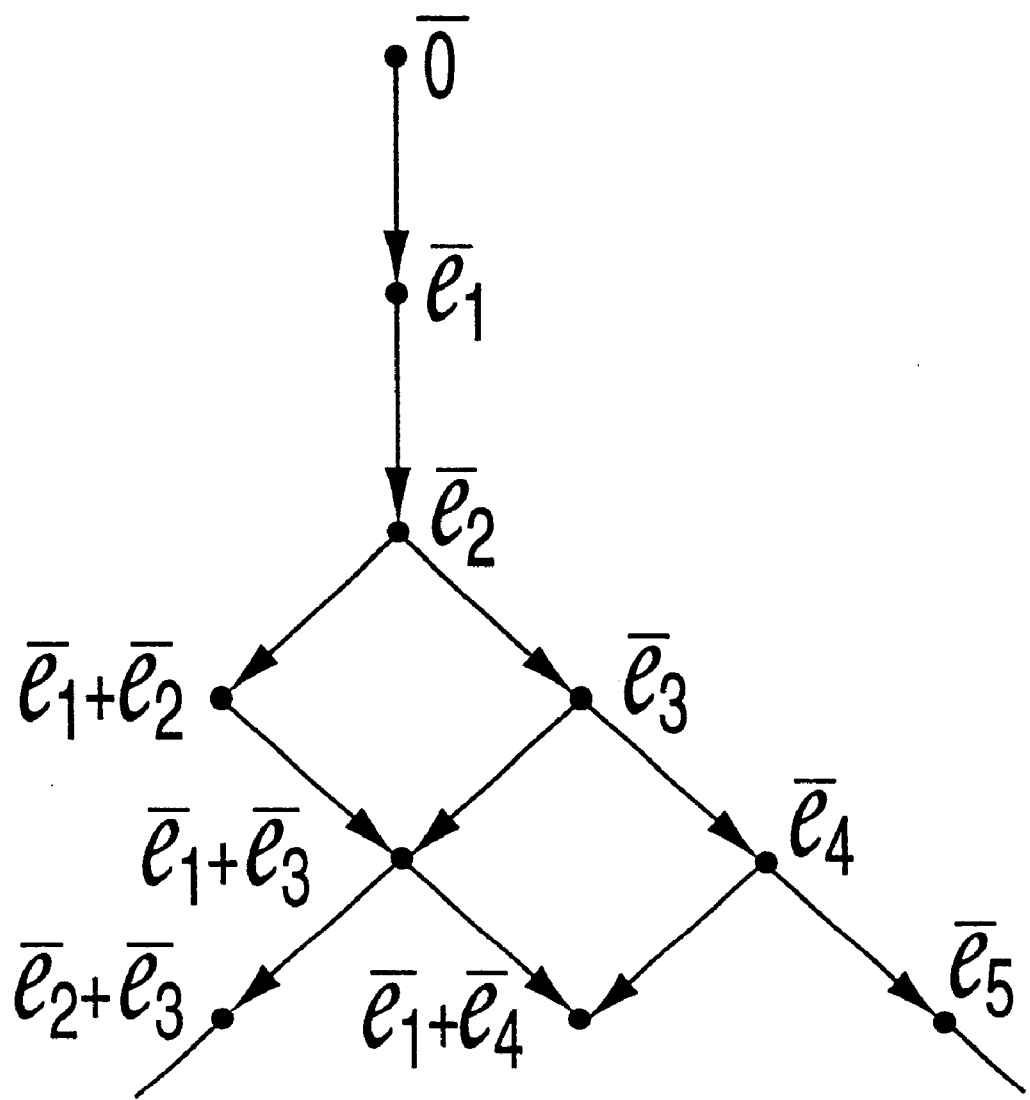
FIG. 9 depicts a tree diagram containing partial schedules as constructed using the present invention.

For example, as illustrated in FIG. 9, starting with letter $\overline{0}$, the routine builds a tree whose nodes are letters. If $\overline{x}$ is such a node, the children of $\overline{x}$ are successors of a letter $\overline{x}$ and, for serial traces, there are exactly SerCount($\overline{x}$) of the successors. As such, the routine produces $\overline{0}$, $\overline{0e}_1$ and $\overline{0e}_1\overline{e}_2$ as successive partial schedules. (The word $\overline{0e}_1\overline{e}_2$ is a directed path from node $\overline{0}$ to node $\overline{e}_2$.) Since $\overline{e}_1+\overline{e}_2$ and $\overline{e}_3$ are successors (children) of $\overline{e}_2$, words $\overline{0e}_1\overline{e}_2(\overline{e}_1+\overline{e}_2)$ and $\overline{0e}_1\overline{e}_2\overline{e}_3$ are partial schedules as well. Now, $\overline{e}_3$ has two successors ($\overline{e}_1+\overline{e}_3$ and $\overline{e}_4$), while $\overline{e}_1+\overline{e}_2$ has only one successor ($\overline{e}_1+\overline{e}_3$). Hence, $\overline{0e}_1\overline{e}_2(\overline{e}_1+\overline{e}_2)(\overline{e}_1+\overline{e}_3)$ and $\overline{0e}_1\overline{e}_2\overline{e}_3(\overline{e}_1+\overline{e}_3)$ and $\overline{0e}_1\overline{e}_2\overline{e}_3\overline{e}_4$ are all partial schedules and so on.

As mentioned previously, letters comprising a given word (or partial schedule) S are distinguished by their positions; so S(1) is the first letter in S, S(2) is the second, and so on. The level of a search tree is denoted by L this is also the length of a partial schedule. Partial schedules of length L are thus paths of length L in a search tree. Function scnt($\overline{x}$) returns the number of successors of $\overline{x}$. As such scnt($\overline{x}$) is either SerCount($\overline{x}$) or MixCount($\overline{x}$) or either of these for a model which includes robot movements. If S is a partial schedule of length L, then S+w or Sw is a partial schedule of length L+1 and S(L+1)=w. Similarly, if length of S is L and S(L)=w, then S−w has length L−1 (in short, + means append a letter and − means remove a letter).

Finally, a commitment to data organization (structure) is necessary in an efficiently designed routine. Keep in mind that the number of chambers (and thus the number of successors of a given word) is relatively small. Thus, it does not make any difference if the routine generates all successors of a given letter and stores them, as opposed to dynamically generating the successors one-by-one as the need arises.

A basic schedule generator routine can be summarized by the following five steps:

1. Initialize the schedule: S←$\overline{0}$ and L←1 and go to Step 2.
2. $\overline{x}$←S(L) and δ←cnt($\overline{x}$). Store δ successors of $\overline{x},\overline{y}_1,\overline{y}_2, \ldots,\overline{y}_\delta$, and mark them unused. Go to Step 3.
3. S←S+$\overline{y}_1$ and L←L+1 and δ←δ−1. Mark $\overline{y}_1$ used and go to Step 4.
4. Compare S(L) with S(1), S(2), . . . ,S(L−1), respectively. If S(i)=S(L) for some i<1, print S and L and go to Step 5; else, go to Step 2.
5. S←S−S(L) and L←L−1. If L=1, STOP; else, go to Step 6.
6. If δ=0, go to Step 5. Else (δ>0), append an unused successor of S(L) to S, mark it used, δ←δ−1, and go to Step 2.

In step 1, the routine initializes the schedule, S, and the level of the search tree, L. Clearly, L must be initialized to 1. As for the initial letter in schedule S, for convenience, the routine uses a letter that has only one successor. A letter $\overline{0}$ corresponds to a situation in which all chambers are empty (i.e., the tool has just begun processing wafers).

In step 2, the routine first finds the number of successors, δ, of the last letter, say $\overline{x}$, in a partial schedule S (clearly, $\overline{x}$=S(1)). Function cnt($\overline{x}$) returns the number of successors of a given letter $\overline{x}$. Then, by using the rules which determine the successor of a given letter, the routine finds, stores and marks unused successors of $\overline{x}$. As a result, a successor may be a record with two fields: the first field is the actual letter, while the second field is a Boolean variable with value true if the successor was not used in a particular partial schedule S and value false otherwise. (Or the routine may use a matrix representation for the list of successors as described in Sections C and D above.)

In step 3, one of the unused successors of the last letter $\overline{x}$ is appended to the partial schedule S, the length of schedule L is increased by 1 and the number of unused successors of $\overline{x}$ is decreased by 1. (There will always be at least one successor to any given letter.)

In step 4, the routine checks if S is a full schedule by comparing the newly added (the last) letter S(L) with all previous letters S(1),S(2), . . . ,S(L−1). (That should be accomplished every time a new letter is appended to a partial schedule.) If S(L) is a repeated letter, the routine prints (stores) the schedule; else, the routine continues with building the schedule.

When a partial schedule becomes a full schedule, S(1)S(2) . . . S(L), after storing the schedule, the routine removes the last letter S(L) and look for some other unused successor of S(L−1). If there are some unused successors, the routine appends a successor to the partial schedule, finds its successors, appends one of these successors and so on. If there are no successors, the routine removes S(L−1) from S and looks for unused successors of S(L−2) and so on. The program terminates when L=1 and δ=0 (meaning there are no unused successors of the first letter).

The routine above is valid for any representation of the scheduling problem. That is, either serial or mixed traces with letters from $\{0,1\}^n$ or either of these traces with robot position being part of the model (and thus alphabet from $\{0,1\}^n \times \{0,1 \ldots ,n\}$). Clearly, functions that count and generate successors of a given letter are different each time.

Figure 10:
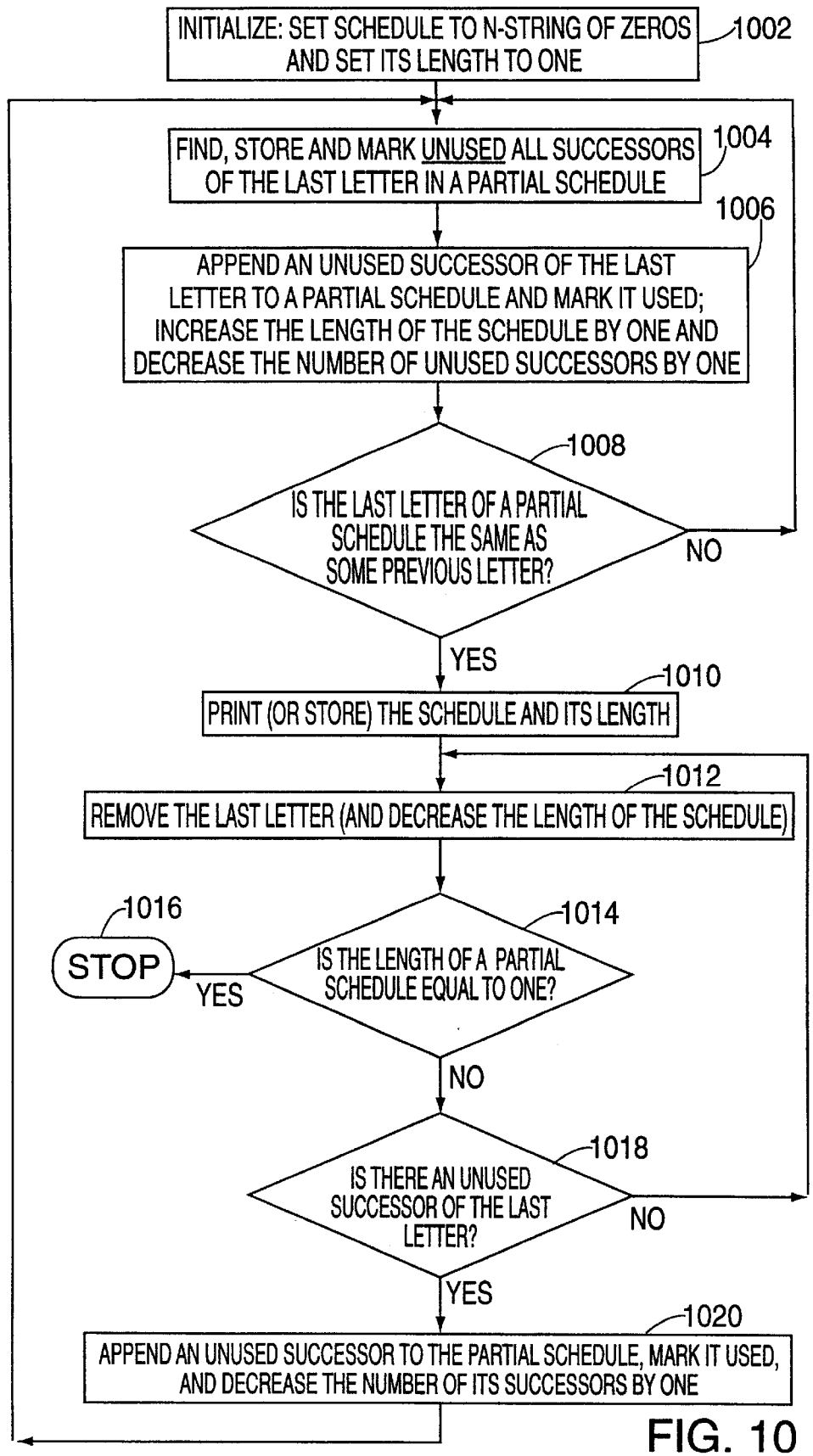
FIG. 10 depicts a flow diagram of a routine for producing all possible schedules for a given trace using a backtracking technique.

FIG. 10 depicts a flow diagram of a schedule generation routine 1000 that operates as generally discussed above. The routine 1000 begins at step 1002 by initializing the schedule, e.g., setting an initial letter to an n-tuple (n-string) of zeros. At step 1004, the routine finds, stores and marks all unused successors of the last letter in a partial schedule. The successor letters are determined using the pseudo-code routines SerGenerator, ParGenerator and MixGenerator and the number of successor letters for each letter is determined using SerCount, ParCount and MixCount. Of course, as mentioned above, if the robot position is to be taken into account, these pseudo-code routines must be appropriately modified to accommodate the expanded letters and the modify rules of successor generation.

Then, at step 1006, the routine appends an unused successor of the last letter to a partial schedule as well as increases the length of the schedule by one and decreases the number of unused successors by one. The routine queries, at step 1008, whether the last letter of the partial trace has been reached. If the query is negatively answered, the routine proceeds along the NO path to step 1004. If the query is affirmatively answered, the routine proceeds to step 1010 where the schedule is either printed or stored.

Steps 1012, 1014, 1016 and 1018 represent a backtracking process. At step 1012, the routine removes the last letter of the schedule to produce a partial schedule and reduce the schedule length by one. Then, at step 1014, the routine queries whether the length of schedule is one. If the query is affirmatively answered, the routine stops at step 1016. However, if the query is negatively answered, the routine proceeds to step 1018. At step 1018, the routine queries whether there is an unused successor to the last letter. If the query is negatively answered, the routine proceeds along the NO path to step 1012. Otherwise, the routine proceeds to step 1020 where an unused successor is appended to the partial schedule. The routine then returns to step 1004.

Once all possible schedules are determined and stored in memory, the schedules are processed by a conventional throughput model. Specifically, each schedule is used by the model to predict a throughput for that schedule. The throughputs for all the schedules are compared to find the schedule having the highest (best) throughput. The schedule with the highest throughput is deemed optimal and is used to control the sequencer. The throughput model may be executed upon the sequencer computer or, more likely, it is executed on a remote computer, and the optimal schedule is downloaded to the sequencer.

The present invention rapidly computes all possible schedules for a given cluster tool configuration. The schedules are then executed by a conventional throughput model to determine the optimal schedule. As such, the present invention facilitates automatic determination of an optimal schedule in a rapid and accurate manner that has heretofore been unavailable in the prior art.

Although various embodiments which incorporate the teachings of the present invention have been shown and described in detail herein, those skilled in the art can readily devise many of the varied embodiments that still incorporate these teachings.

What is claimed is:

1. A schedule data structure, stored in a computer readable storage medium, of a schedule for processing a wafer in a multichamber semiconductor wafer processing tool comprising:

a plurality of n-tuples, where n is a total number of possible wafer positions, and the plurality of n-tuples contains only one duplicate n-tuple.

2. The schedule data structure of claim 1 wherein n is a total number of possible wafer positions plus a position of transport robot position.

3. The schedule data structure of claim 1 wherein the n-tuple has a form $(x_1, x_2, x_3, \ldots, x_n)$, where x defines the contents of a particular chamber at a particular point in a schedule and x has a value 0 when a wafer is not positioned in the chamber and a value of 1 when a wafer is positioned in the chamber.

* * * * *